(12) United States Patent
Kim et al.

(10) Patent No.: US 8,618,627 B2
(45) Date of Patent: Dec. 31, 2013

(54) SHIELDED LEVEL SHIFT TRANSISTOR

(75) Inventors: Sunglyong Kim, Falmouth, ME (US); Jongjib Kim, Falmouth, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 20 days.

(21) Appl. No.: 12/822,471

(22) Filed: Jun. 24, 2010

(65) Prior Publication Data

US 2011/0316078 A1 Dec. 29, 2011

(51) Int. Cl.
*H01L 27/06* (2006.01)
*H01L 27/088* (2006.01)

(52) U.S. Cl.
USPC ........... 257/500; 257/492; 257/493; 257/504; 257/544; 438/174; 438/289

(58) Field of Classification Search
USPC ................. 257/500–504, 488, 490, 492–493, 257/544–548, E21.409; 438/174, 289
See application file for complete search history.

(56) References Cited

U.S. PATENT DOCUMENTS

| | | | |
|---|---|---|---|
| 4,866,455 A | 9/1989 | Lichtblau |
| 4,866,495 A | 9/1989 | Kinzer |
| 5,023,678 A | 6/1991 | Kinzer |
| 5,040,045 A | 8/1991 | McArthur et al. |
| 5,043,781 A | 8/1991 | Nishiura et al. |
| 5,204,545 A | 4/1993 | Terashima |
| 5,270,568 A | 12/1993 | Terashima |
| 5,279,977 A | 1/1994 | Kida et al. |
| 5,334,546 A | 8/1994 | Terashima |
| 5,426,325 A | 6/1995 | Chang et al. |
| 5,428,241 A | 6/1995 | Terashima |
| 5,455,439 A | 10/1995 | Terashima et al. |
| 5,583,365 A | 12/1996 | Villa et al. |
| 5,595,921 A | 1/1997 | Villa et al. |
| 5,686,754 A | 11/1997 | Choi et al. |
| 5,731,628 A | 3/1998 | Terashima |
| 5,736,774 A | 4/1998 | Fujihira |
| 5,801,418 A * | 9/1998 | Ranjan .......................... 257/336 |

(Continued)

FOREIGN PATENT DOCUMENTS

| | | |
|---|---|---|
| CN | 102368498 A | 3/2012 |
| KR | 1020110140113 A | 12/2011 |
| TW | 201214672 A | 4/2012 |

OTHER PUBLICATIONS

"Adaptive Ballast Control IC", *International Rectifier, Data Sheet No. PD60212 revC*, IR2520D(S) & (PbF), (Mar. 2005), 17 pgs.

(Continued)

*Primary Examiner* — Laura Menz
*Assistant Examiner* — Maliheh Malek
(74) *Attorney, Agent, or Firm* — Schwegman Lundberg Woessner P.A.

(57) ABSTRACT

A semiconductor device can include a transistor and an isolation region. The transistor is formed in a semiconductor substrate having a first conductivity type. The transistor includes a drift region extending from a drain region toward a source region and having a second conductivity type. The drift region includes a first resurf region near a working top surface and having the first conductivity type. The high voltage isolation island region includes a first well region laterally offset from the drift region. The first well region has the second conductivity type. An isolation region is located laterally between the drain region and the first well region. The isolation region comprises a portion of the semiconductor substrate extending to the top working surface.

19 Claims, 3 Drawing Sheets

(56) References Cited

U.S. PATENT DOCUMENTS

| | | | |
|---|---|---|---|
| 5,801,431 A | 9/1998 | Ranjan | |
| 5,861,657 A | 1/1999 | Ranjan | |
| 5,889,310 A | 3/1999 | Terashima et al. | |
| 5,894,156 A * | 4/1999 | Terashima et al. | 257/374 |
| 5,907,182 A | 5/1999 | Terashima | |
| 6,043,534 A | 3/2000 | Sogo | |
| 6,124,628 A | 9/2000 | Fujihira et al. | |
| 6,225,673 B1 * | 5/2001 | Pendharkar et al. | 257/502 |
| 6,600,206 B2 * | 7/2003 | Jeon et al. | 257/500 |
| 6,724,041 B2 * | 4/2004 | Rumenik et al. | 257/336 |
| 6,818,490 B2 * | 11/2004 | Disney | 438/199 |
| 6,888,210 B2 | 5/2005 | Jeon et al. | |
| 7,439,122 B2 * | 10/2008 | Shimizu | 438/218 |
| 7,476,942 B2 * | 1/2009 | Watanabe et al. | 257/370 |
| 7,582,946 B2 * | 9/2009 | Shimizu | 257/501 |
| 7,741,695 B2 * | 6/2010 | Shimizu | 257/502 |
| 7,759,759 B2 * | 7/2010 | Tsuchiko | 257/471 |
| 2002/0050613 A1 * | 5/2002 | Rumennik et al. | 257/325 |
| 2002/0053698 A1 * | 5/2002 | Rumennik et al. | 257/342 |
| 2002/0113286 A1 * | 8/2002 | Shimizu | 257/502 |
| 2004/0036115 A1 * | 2/2004 | Disney | 257/342 |
| 2004/0217419 A1 * | 11/2004 | Rumennik et al. | 257/343 |
| 2005/0056898 A1 * | 3/2005 | Kaneko et al. | 257/373 |
| 2005/0212073 A1 * | 9/2005 | Iwabuchi | 257/492 |
| 2007/0013022 A1 * | 1/2007 | Shimizu | 257/500 |
| 2007/0018250 A1 * | 1/2007 | Cai et al. | 257/368 |
| 2007/0187798 A1 * | 8/2007 | Rittaku et al. | 257/501 |
| 2008/0074165 A1 * | 3/2008 | Jeon et al. | 327/333 |
| 2008/0203519 A1 * | 8/2008 | Min et al. | 257/501 |
| 2009/0101974 A1 * | 4/2009 | Saito et al. | 257/342 |
| 2010/0176480 A1 * | 7/2010 | Senda et al. | 257/501 |
| 2010/0283116 A1 * | 11/2010 | Shimizu | 257/500 |
| 2010/0314710 A1 * | 12/2010 | Yamaji | 257/501 |
| 2011/0127602 A1 * | 6/2011 | Mallikarjunaswamy | 257/331 |
| 2011/0133269 A1 * | 6/2011 | Yamaji | 257/328 |

OTHER PUBLICATIONS

"Current Sensing Single Channel Driver", *International Rectifier, Data Sheet No. PD60143K*, IR2127/IR2128 IR21271/1R21281, (Jan 2000), 15 pgs.

* cited by examiner

SHIELDED LEVEL SHIFT TRANSISTOR

BACKGROUND

Power semiconductors are widely used in various applications. Many devices that use power semiconductors are controlled by low voltage integrated circuits (ICs) of several tens of volts or less. These low-voltage ICs can control high-voltage driver circuits of several hundreds of volts that provide high-voltage power to other electronics. To reduce size and increase performance, the ICs having the low-voltage controls can provide for a direct connection to the high-voltage driver circuits. Accordingly, these ICs have low-voltage regions and high-voltage regions.

The high-voltage regions on the ICs are electrically isolated from the low-voltage regions by an isolation junction to limit the effect of the high voltage on the low-voltage components. Since the high-voltage region and the low-voltage region are on the same piece of silicon, the isolation junction is typically a p-n junction forming a diode between the two regions. One or more control signals, however, travel from the low-voltage control circuits to the high-voltage region. In order for these low-voltage control signals to be appropriate for a high-voltage component, the low-voltage signal is level shifted up to a higher voltage with a level-shift transistor. Caution is exercised in the design of the IC to enable the low-voltage control signal to be level shifted up to the high voltage and enter the high-voltage region without affecting the isolation of the high-voltage region.

OVERVIEW

The present inventors have recognized, among other things, a semiconductor device having a transistor (e.g., a level-shift transistor) and an isolation region (e.g., a high voltage isolation region). In an example, the level-shift transistor and the high-voltage region can be implemented with a single n-well isolated from each other by a substrate region. The single n-well can include a diffusion region formed in the semiconductor substrate and can be used to implement the drift region for the level-shift transistor and the high-side region. The level-shift transistor can include a resurf top p-well diffusion region to deplete the n-well of the level-shift transistor. With the top p-well diffusion region to deplete the n-well, the single n-well can have a high enough dose to form a strong diode for isolation of the high-voltage region.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventor has recognized, among other things, that a level-shift transistor and a high-voltage region can be implemented with a single n-well isolated from each other by a substrate region. The single n-well can include a diffusion region formed in a semiconductor substrate, and can be used to implement the drift region for the level-shift transistor and the high-side region. The level-shift transistor can include a top p-well diffusion region to deplete the n-well of the level-shift transistor. With the top p-well diffusion region to deplete the n-well, the single n-well can have a high enough dose to form a strong diode for isolation of the high-voltage region.

Figure 1:
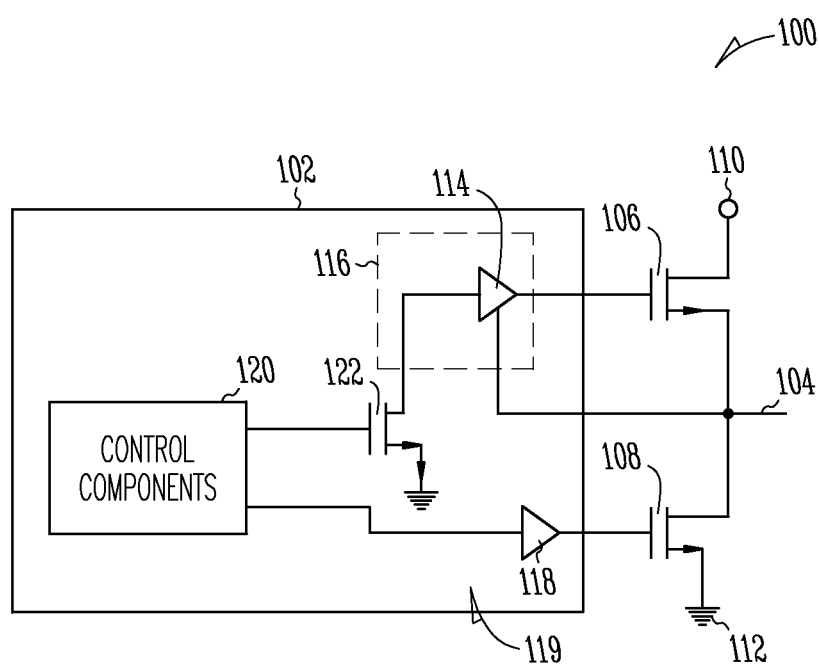
FIG. 1 illustrates generally an example of a block diagram of a high voltage integrated circuit.

FIG. 1 illustrates generally an example block diagram of a circuit 100 in which a high voltage integrated circuit (IC) 102 having a level-shift transistor and a high voltage region can be implemented. The circuit 100 can include controls and drivers for a load 104 driven by a high side transistor 106 and a low side transistor 108. The high side transistor 106 and low side transistor 108 are controlled by the high voltage IC 102. In an example, the high side transistor 106 and the low side transistor 108 are field effect transistors (FETs). The high side transistor 106 has a drain coupled to a high voltage source 110 and a source coupled to the load 104. The drain of the low side transistor 108 can be coupled to the load and the source of the low side transistor 108 can be coupled to ground 112. The gate of the high side transistor 106 can be coupled to a high side gate driver 114 in a high voltage region 116 on the high voltage IC 102. The gate of the low side transistor 108 can be coupled to a low side driver 118 in a low voltage region 119 on the high voltage IC 102.

As mentioned above, the high voltage IC 102 can include a low voltage region 119 having digital and analog control components 120 and a high voltage region 116 having the high side gate driver 114 and associated high voltage components. In an example, components (e.g., control components 120) in the low voltage region 119 operate on voltages from 0 to 30V, and components in the high voltage region 116 operate on voltages from 0 to 600V. In an example, one or more level-shift transistors 122 shift a voltage of a control signal from a low voltage to a high voltage in order to control the high side gate driver 114 and associated circuitry.

In operation, control signals can be generated by the control components 120 to control the operation of the high side transistor 106 and the low side transistor 108. The control signals for the low side transistor 108 can be sent as low voltage signals to the low side gate driver 118. The control signals for the high side transistor 106 can be level-shifted up from a low voltage signal (e.g., 0V to 30V) to a high voltage signal (e.g., 600V) and sent to the high side gate driver 114. The high side gate driver 114 and low side gate driver 118 can then control the voltage at the gates of the high side transistor 106 and low side transistor 108 to control the voltage and current supplied to the load 104.

The high voltage region 116 can be exposed to the high voltage of the floating gate of the high side transistor 106. The high voltage in the high voltage region 114 can interfere with and damage the low voltage components 120. Accordingly, the high voltage region 114 can be electrically isolated from the low voltage region 119. The level-shift transistor 122 can also be configured to have a breakdown voltage large enough to withstand the voltage differential between the high voltage region 120 and the low voltage region 119.

Figure 2:
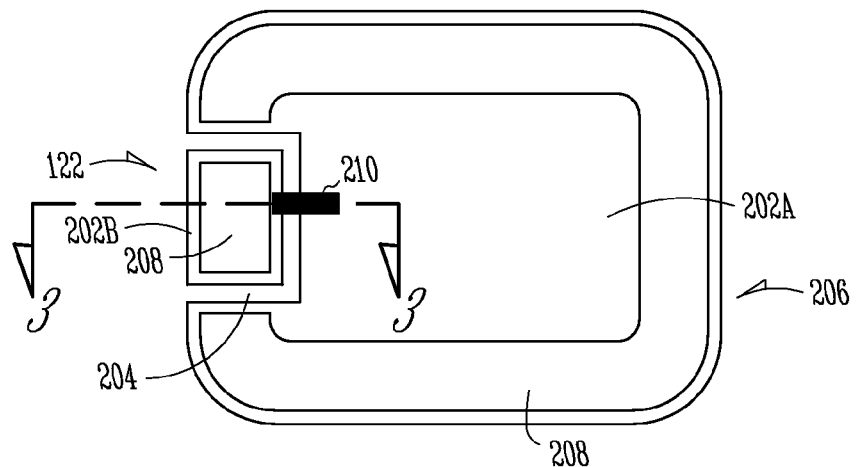
FIG. 2 illustrates generally an example top view of the high voltage integrated circuit showing a level-shift transistor and a high voltage region.

FIG. 2 illustrates an example top view of the high voltage region 116 and the level shift transistor 122 of the high voltage IC 102. To simplify the illustration, the high voltage gate driver 114 and associated components are not shown in this view.

The high voltage region 116 and the level-shift transistor 122 can be formed by a first well 202A, 202B in a semiconductor substrate 200. The first well 202A, 202B can include two regions, a high voltage isolation island region 202A and a drift region 202B for the level-shift transistor 122. In an example, the isolation island region 202A and the drift region 202B can be formed in the same diffusion steps of fabrication of the high voltage IC 102 and can have about the same peak doping concentrations. In an example, the first well 202A, 202B is an n-well in a p-type substrate.

In an example, the drift region 202B is separated from the isolation island region 202A by an isolation region 204. The first well 202A, 202B can be formed such that the isolation region 204 is a portion of the semiconductor substrate that extends between the drift region 202B and the isolation island region 202A to the top working surface of the high voltage IC 102. In an example, the level-shift transistor 122 is surrounded laterally on three sides by the isolation region 204 and the isolation island region 202A.

The high voltage region 116 can be isolated from the low voltage region 119 by a high voltage junction termination region 206. The high voltage junction termination region 206 can be formed by a p-n junction (shown in FIG. 3) between the first well 202A, 202B, and the semiconductor substrate. The high voltage junction region 206 can include a second diffusion well 208 functioning as a reduced surface field (resurf) region in the first well 202A, 202B. In an example, the second diffusion well 208, as a resurf region, can function to reduce the electric field near the top working surface of the high voltage IC 102. Reducing the surface field can help maintain the breakdown voltage of the p-n junction for the high voltage junction termination region 206. Accordingly, the second well 208 can help to isolate the high voltage region 116 from the low voltage region 119. In an example, the second well 208 is a p-well that is located in an n-type first well 202A, 202B.

In an example, the high voltage region 116 can be electrically isolated on all sides. In an example, the high voltage junction termination region 206 can form a perimeter near an outer edge of the first well 202A, 202B. In an example, the high voltage junction termination region 206 forms a complete perimeter near the outer edge of the first well 202A, 202B. In another example, the high voltage junction termination region 206 forms a partial perimeter near the outer edge of the first well 202A, 202B, and the perimeter is completed by the edge of the high voltage IC 102. For example, the high voltage region 116 can abut an edge of the high voltage IC 102. Thus, the high voltage region 116 can be isolated on that portion of the perimeter by the edge of the high voltage IC 102. In an example, the second well 208 contacts the semiconductor substrate at the outer edge of the isolation island region 202A.

In an example, the second well 208 extends through the isolation region 204 and across the level-shift transistor 122. In the level-shift transistor 122, the second well 208 can also function as a resurf structure. Here, the second well 208 functions to reduce the surface field in the drift region 202B of the level-shift transistor 122. This surface field reduction increases the breakdown voltage for the level-shift transistor 122. The level-shift transistor 122 is considered to be shielded since the transistor 122 is integrated into the high voltage junction termination region 206. The high voltage IC 102 also includes a high voltage interconnect 210 that couples the level-shift transistor 122 to one or more components in the isolation island region 202A.

Figure 3:
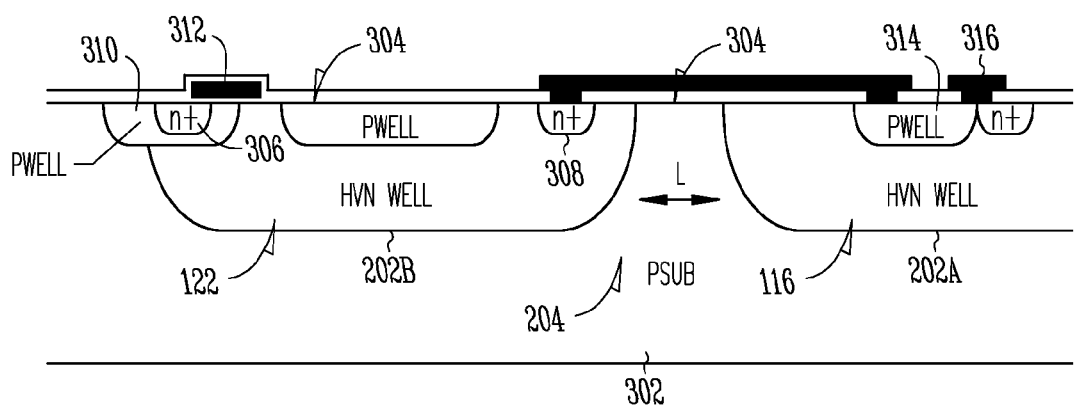
FIG. 3 illustrates generally an example cross section for the high voltage integrated circuit of FIG. 2.

FIG. 3 illustrates an example cross-section of a portion of the high voltage IC 102 from FIG. 2. The cross-section of FIG. 3 illustrates a view across the level-shift transistor 122, the isolation region 204, and into a portion of the high voltage isolation region 116. The cross-section of FIG. 3 is taken along the level-shift transistor 122, across the isolation region 204, and into a portion of the high voltage region 116. As mentioned above, the high voltage IC 102 comprises a semiconductor substrate 302 having a level-shift transistor 122 and a high voltage region 116 fabricated in the working top surface 304 of the semiconductor substrate 302. In an example, the semiconductor substrate 302 is a p-type semiconductor.

As mentioned above, the drift region 202B for the level-shift transistor 122 and the high voltage isolation island region 202A for the high voltage region 116 can be formed in the same diffusion steps. In an example, the drift region 202B and the high voltage isolation island region 202A are n-type diffusion well in the semiconductor substrate 302. The level-shift transistor 122 can include a source region 306 near the working top surface 304. In an example, the source region 306 comprises a heavily doped n-type diffusion well. In an example, the source region 306 is diffused into another p-type diffusion well 310 between the source region 306 and the drift region 202B. The level-shift transistor 122 also includes a drain region 308 near the working top surface 304 and laterally offset from the source region 306. In an example, the drain region 308 comprises a heavily doped n-type diffusion well in the drift region 202B. A gate 312 for the level-shift transistor 122 can be located above the working top surface 304 laterally between the source region 306 and the drain region 308. The gate 312 can be located above a portion of the well 310 that extends to the working top surface 304 between the source region 306 and the drift region 202B.

The level-shift transistor 122 can also include the second well 208 near the top working surface 304 and within the drift region 202B. The second well 208 can function as a resurf structure. When the level-shift transistor 122 is in an off state, the second well 208 can help to deplete the drift region 202A. The depletion of the drift region 202A can enable the drift region 202A to have a higher doping concentration while maintaining a high breakdown voltage. In an example, the breakdown voltage of the level-shift transistor 122 is greater than 700V. Using the second well 208 to deplete the drift region 202B enables the drift region 202B to have the same, or a corresponding, peak doping concentration as the high voltage isolation island 202A for the high voltage region 116. The well 202A for the high voltage region 116 can have a high peak doping concentration in order to form a high breakdown high voltage junction termination region 206. The high peak doping concentration makes the high punch through voltage from the semiconductor devices in the high voltage region 116 to the lightly doped semiconductor substrate 302. The second well 208 enables the drift region 202B to have a high peak doping concentration like the well 202A for the high voltage region 116.

The high voltage interconnect 210 couples the drain region 308 of the level-shift transistor 122 to a p-well 314 in the high voltage region 116. The p-well 314 can be connected to a conducting node 316 that can be used to couple to other components in the high voltage region 116. In an example, the p-well 314 functions as a resistor coupled in series with the level-shift transistor 122. The high voltage interconnect 210 comprises a conductive material (e.g., a copper trace).

As shown in FIG. 3, the drift region 202B and the well 202A for the high voltage region 116 are formed to leave the isolation region 204 laterally between the drift region 202B and the well 202A. Thus, the semiconductor substrate 302 extends to the top working surface 304 to form the isolation region 204. In an example, the isolation region 204 has a length "L" of 28 micrometers. In an example, the length "L" comprises the distance between the drift region 202B and the well 202A of the high voltage region 116. The larger the length "L", the greater the punch-through voltage from the well 202A to the drift region 312. The length "L" also depends on the substrate resistivity.

Figure 4A:
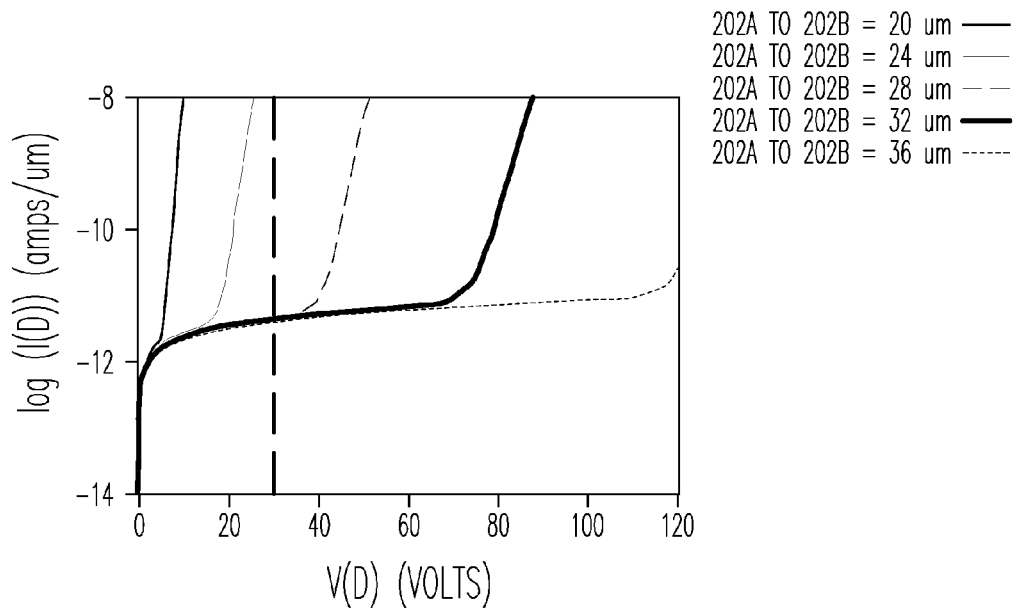
FIGS. 4A and 4B illustrate simulation results corresponding to variations in an isolation region between the high voltage region and the level-shift transistor.
Figure 4B:
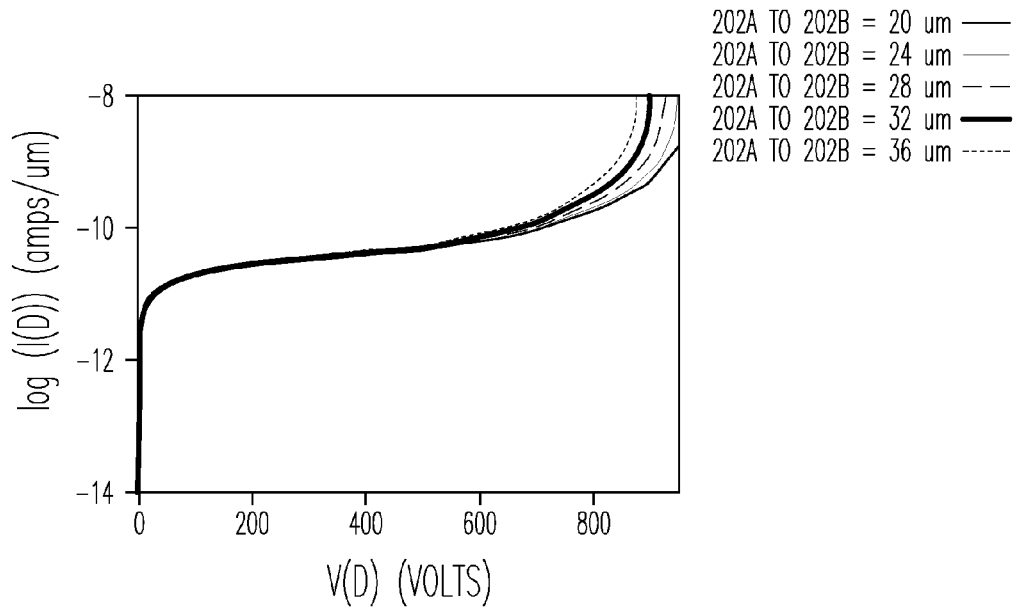

FIGS. 4A and 4B illustrate simulation results corresponding to variations in the length "L" of the isolation region 204. As shown in FIG. 4A, a length "L" of at least 28 micrometers corresponds to a punch-through voltage of at least 30V. Additionally, lengths "L" of the isolation region 204 above 20 micrometers have little effect on the breakdown voltage of the level-shift transistor 122 as shown in FIG. 4B.

Forming the drift region 202B and the well 202A with a single diffusion well has several advantageous. For example, the drift region 202B and the well 202A can be formed during the same diffusion steps and using the same mask, therefore reducing the processing time and cost involved in fabricating the high voltage IC 102. Additionally, by forming the drift region 202B and the high voltage isolation island region 202A with a diffusion well and not an epitaxial layer, design adjustments can be made to the drift region 202B and the high voltage isolation island region 202A without affecting other components on the high voltage IC 102. This is because the diffusion wells can be easily formed for small areas such as the drift region 202B and the high voltage isolation island region 202A, while epitaxial layers are typically formed across all or a large area of the semiconductor substrate 102. Thus, for example, changing the thickness of the drift region 202B and the well 202A has minimal affect on other areas of the high voltage IC 102.

Additional Notes

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventor also contemplates examples in which only those elements shown or described are provided. Moreover, the present inventor also contemplates examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An integrated circuit comprising:
    a level-shift transistor including:
        a source region near a working top surface of a semiconductor substrate, the semiconductor substrate having a first conductivity type;
        a drain region near the working top surface and laterally offset from the source region;
        a drift region extending from the drain region toward the source region, the drift region having a second conductivity type, the drift region including a first resurf region within the drift region near the working top surface and having the first conductivity type; and
        a gate located above the working top surface and laterally between the source and drain regions;
    a high voltage region including:
        a first well region laterally offset from the drift region, the first well region having the second conductivity type;
    a high voltage interconnect coupling the level-shift transistor to the high voltage region; and
    an isolation region located laterally between the level-shift transistor and the high voltage region, the isolation region comprising a portion of the semiconductor substrate extending to the top working surface.

2. The integrated circuit of claim 1, comprising:
    a second resurf region within the first well region near the working top surface and having the first conductivity type.

3. The integrated circuit of claim 2, wherein the first resurf region and the second resurf region include a single well.

4. The integrated circuit of claim 1, wherein the first well region is laterally offset from the drift region in at least two axes parallel to the working top surface, and wherein the isolation region is between the first well region and the drift region in the at least two axes.

5. The integrated circuit of claim 1, wherein the drift region and the first well region have about the same peak doping concentration.

6. The integrated circuit of claim 1, wherein the drift region and the first well region include a single well separated by the isolation region.

7. The integrated circuit of claim 1, wherein the level-shift transistor is configured to shift a level of a signal at the gate up from a low voltage plane to a high voltage plane.

8. The integrated circuit of claim 1, wherein the high voltage region includes:
 a resistive region within the first well and having the first conductivity type, the resistive region coupled to the high voltage interconnect on a first end and to a conducting node on a second end.

9. The integrated circuit of claim 1, wherein the source region is coupled to the gate; and
 wherein the high voltage interconnect couples the drain region to the high voltage region.

10. The integrated circuit of claim 1, wherein the level-shift transistor comprises an N-type field effect transistor.

11. The integrated circuit of claim 1, comprising a second level-shift transistor including:
 a second source region near the working top surface of the semiconductor substrate;
 a second drain region near the working top surface and laterally offset from the second source region;
 a second drift region extending from the second drain region toward the second source region, the second drift region having a second conductivity type, the second drift region including a third resurf region within the second drift region near the working top surface and having the first conductivity type; and
 a second gate located above the working top surface and located laterally between the second source and second drain regions;
 wherein the first well region of the high voltage region is laterally offset from the second drift region;
 wherein the high voltage interconnect couples the second drain region to the high voltage region; and
 wherein the isolation region is located laterally between the second drain region and the first well region.

12. A semiconductor device comprising:
 a semiconductor substrate having a first conductivity type;
 a first well in the semiconductor substrate, the first well having the second conductivity type, wherein the first well includes a drift region of a level-shift transistor, the drift region laterally separated from a high voltage isolation island region by an isolation region comprising a portion of the semiconductor substrate extending to a top working surface of the semiconductor substrate;
 a second well near the working top surface in the first well and having the first conductivity type, wherein the second well forms a resurf structure for the drift region and a resurf structure around a perimeter of the high voltage isolation island region; and
 a high voltage interconnect above the working top surface of the semiconductor substrate and coupling the drift region to the high voltage isolation island region.

13. The semiconductor device of claim 12, wherein the drift region and the high voltage isolation island region include a single diffusion well having two areas isolated by an isolation region.

14. The semiconductor device of claim 12, wherein the high voltage isolation island region is laterally offset from the drift region in at least two axes parallel to the working top surface, and wherein the isolation region is between the high voltage isolation island region and the drift region in the at least two axes.

15. The semiconductor device of claim 12, wherein the drift region and the high voltage isolation island region have about the same peak doping concentration.

16. The semiconductor device of claim 12, wherein the level-shift transistor is configured to shift a level of a signal at the gate up from a low voltage plane to a high voltage plane.

17. The semiconductor device of claim 16, wherein the level-shift transistor comprises an N-type field effect transistor.

18. The semiconductor device of claim 12, wherein the high voltage region includes:
 a resistive region having the first conductivity type, the resistive region coupled to the high voltage interconnect on a first end and to a conducting node on a second end.

19. The semiconductor device of claim 12, wherein the high voltage isolation island region is laterally offset from the drift region in the at least two axes by at least 28 micrometers.

* * * * *